(12) United States Patent
Yamamoto et al.

(10) Patent No.: US 11,380,642 B2
(45) Date of Patent: Jul. 5, 2022

(54) COPPER PILLAR BUMP HAVING ANNULAR PROTRUSION

(71) Applicant: SHINKO ELECTRIC INDUSTRIES CO., LTD., Nagano (JP)

(72) Inventors: Kengo Yamamoto, Nagano (JP); Daisuke Ito, Nagano (JP); Mitsuaki Okubo, Nagano (JP); Kenji Uchida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/090,082

(22) Filed: Nov. 5, 2020

(65) Prior Publication Data
US 2021/0175193 A1  Jun. 10, 2021

(30) Foreign Application Priority Data
Dec. 5, 2019  (JP) .............................. JP2019-220606

(51) Int. Cl.
*H01L 23/00* (2006.01)
*H01L 23/488* (2006.01)
*H01L 23/532* (2006.01)

(52) U.S. Cl.
CPC ............ *H01L 24/14* (2013.01); *H01L 23/488* (2013.01); *H01L 23/53238* (2013.01)

(58) Field of Classification Search
CPC ....... H01L 24/14; H01L 24/03; H01L 23/488; H01L 24/81; H01L 24/11; H01L 24/13; H01L 24/32; H01L 24/92; H01L 23/53238; H01L 25/0657; H01L 23/49816; H01L 24/05; H01L 23/49822; H01L 24/16; H01L 23/49827
USPC ........ 438/108, 612, 613, 107; 257/737, 753, 257/23.06
See application file for complete search history.

(56) References Cited

U.S. PATENT DOCUMENTS

| | | | |
|---|---|---|---|
| 10,403,590 B2 | 9/2019 | Jadhav et al. | |
| 2013/0171457 A1* | 7/2013 | Matsuda | C25D 3/58 |
| | | | 428/447 |
| 2016/0322321 A1* | 11/2016 | Yajima | H01L 24/11 |
| 2017/0148753 A1* | 5/2017 | Choi | H01L 24/11 |
| 2019/0189577 A1* | 6/2019 | Chen | H01L 24/13 |

FOREIGN PATENT DOCUMENTS

JP       2006-295109       10/2006

* cited by examiner

*Primary Examiner* — Mouloucoulaye Inoussa
(74) *Attorney, Agent, or Firm* — IPUSA, PLLC

(57) ABSTRACT

A copper pillar bump for an electrode pad of a semiconductor chip includes a first copper layer, a first metal layer formed directly on the first copper layer, a second copper layer formed directly on the first metal layer, and a second metal layer formed directly on the second copper layer, wherein the first metal layer and the second metal layer are made of a metal having a different etching rate than copper, wherein an outer perimeter ring of the first metal layer protrudes beyond a lateral surface of the first copper layer, and wherein an outer perimeter ring of the second metal layer protrudes beyond a lateral surface of the second copper layer.

11 Claims, 8 Drawing Sheets

COPPER PILLAR BUMP HAVING ANNULAR PROTRUSION

CROSS-REFERENCE TO RELATED APPLICATIONS

The present application is based on and claims priority to Japanese Patent Application No. 2019-220606 filed on Dec. 5, 2019, with the Japanese Patent Office, the entire contents of which are incorporated herein by reference.

FIELD

The disclosures herein relate to a copper pillar bump, a semiconductor chip, and a semiconductor apparatus.

BACKGROUND

A semiconductor apparatus having a semiconductor chip mounted on an interconnect substrate is known in the art. Such a semiconductor apparatus may be provided with bumps disposed on the electrode pads of the semiconductor chip for connection with the pads of the interconnect substrate. Examples of the structure of bumps include a structure in which a plurality of metal layers made of different materials are laminated together. The bumps of the semiconductor chip and the pads of the interconnect substrate are connected via solders.

Securing reliable connection between a semiconductor chip and an interconnect substrate requires a sufficient amount of solder. A large amount of solder, however, may cause excess solder to creep along the lateral surface of a bump to come in contact with the semiconductor chip. In such a case, solder coming in contact with the semiconductor chip may cause trouble such as a short-circuit or the like Accordingly, it may be desired to provide a copper pillar bump having a structure that reduces the likelihood of excess bump creeping along the lateral surface.

[Patent Document 1] Japanese Laid-open Patent Publication No. 2006-295109

[Patent Document 2] U.S. Pat. No. 10,403,590

SUMMARY

According to an aspect of the embodiment, a copper pillar bump for an electrode pad of a semiconductor chip includes a first copper layer, a first metal layer formed directly on the first copper layer, a second copper layer formed directly on the first metal layer, and a second metal layer formed directly on the second copper layer, wherein the first metal layer and the second metal layer are made of a metal having a different etching rate than copper, wherein an outer perimeter ring of the first metal layer protrudes beyond a lateral surface of the first copper layer, and wherein an outer perimeter ring of the second metal layer protrudes beyond a lateral surface of the second copper layer.

According to at least one embodiment, a copper pillar bump is provided with a structure that reduces the likelihood of excess bump creeping along the lateral surface.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Structure of Copper Pillar Bump of First Embodiment

Figure 1:
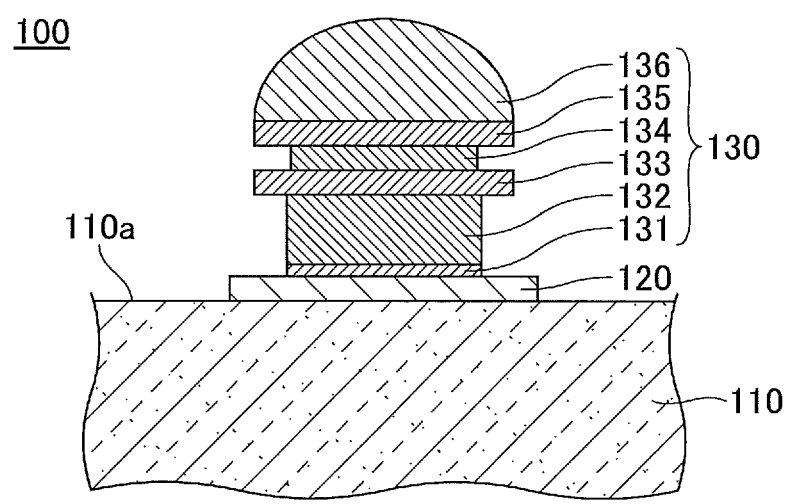
FIG. 1 is a partial cross-sectional view illustrating an example of a semiconductor chip having a copper pillar bump according to a first embodiment.

FIG. 1 is a partial cross-sectional view illustrating an example of a semiconductor chip having a copper pillar bump according to a first embodiment. In FIG. 1, a semiconductor chip 100 includes a semiconductor substrate 110, an electrode pad 120, and a copper pillar bump 130.

In the present embodiment, for the sake of convenience, the electrode-pad-120 side of the semiconductor chip 100 is referred to as an upper side or a first side, and the opposite side thereof is referred to as a lower side or a second side. A surface (or face) of the semiconductor chip 100 on the electrode-pad-120 side is referred to as a first surface (or first face) or an upper surface (or upper face), and a surface (or face) opposite thereto is referred to as a second surface (or second face) or a lower surface (or lower face). It may be noted, however, that the semiconductor chip 100 may be used in an upside-down position, or may be placed at any angle. Further, a plan view refers to a view taken in the direction perpendicular to a circuit surface 110a of the semiconductor chip 100, and a plane shape refers to the shape of an object as viewed in the direction perpendicular to the circuit surface 110a of the semiconductor chip 100.

The semiconductor chip 100 has a semiconductor integrated circuit (not shown) and the like formed in the semiconductor substrate 110 that is a thin plate made of silicon or the like, for example. The electrode pad 120, which is electrically connected to the semiconductor integrated circuit (not shown), is formed on the semiconductor substrate 110. The electrode pad 120 is made of aluminum, for example.

The copper pillar bump 130 is formed on the electrode pad 120 of the semiconductor chip 100. The copper pillar bump 130 has a structure constituted by a metal layer 131, a copper layer 132, a nickel layer 133, a copper layer 134, nickel layer 135, a solder layer 136 stacked one on another in this order on the electrode pad 120. In a plan view, the copper pillar bump 130 has a smaller area than the electrode pad 120, so that an outer ring of the electrode pad 120 is exposed beyond the outer perimeter of the copper pillar bump 130.

The metal layer 131, which serves as a seed layer for forming the copper layer 132, is formed directly on the electrode pad 120 (i.e., formed in direct contact with the upper surface of the electrode pad 120). The material of the metal layer 131 may be copper (Cu), titanium (Ti), chrome (Cr), tungsten (W), an alloy of two or more of these metals, or a multilayered film comprised of two or more layers of these metals. The thickness of the metal layer 131 may approximately be 0.01 to 0.3 micrometers, for example. The plane shape of the metal layer 131 may be substantially circular, for example. In this case, the diameter of the metal layer 131 may approximately be 10 to 100 micrometers, and preferably 25 to 50 micrometers. In the present embodiment, the metal layer 131 is a laminated film having a titanium layer and a copper layer laminated thereon.

The copper layer 132, which is an electroplated layer, is formed directly on the metal layer 131. The thickness of the copper layer 132 may approximately be 10 to 200 micrometers, and preferably 20 to 150 micrometers, for example. The plane shape of the copper layer 132 is substantially the same as the plane shape of the metal layer 131. The copper layer 132 is formed to align with the metal layer 131 in a plan view.

The nickel layer 133, which is an electroplated layer, is formed directly on the copper layer 132. The thickness of the nickel layer 133 may approximately be 2 to 20 micrometers, and preferably 5 to 10 micrometers, for example. The plane shape of the nickel layer 133 may be substantially circular, for example. In this case, the diameter of the nickel layer 133 is approximately 1 to 20 micrometers larger than the diameter of the copper layer 132. In other words, an outer perimeter ring of the nickel layer 133 protrudes beyond the lateral surface of the copper layer 132. The amount of protrusion may be adjustable to be approximately 0.5 to 10 micrometers, and may preferably be about 2 to 5 micrometers. The amount of protrusion of an outer perimeter ring of the nickel layer 133 extending beyond the lateral surface of the copper layer 132 is greater than the thickness of the metal layer 131 (i.e., seed layer) situated directly beneath the copper layer 132.

The copper layer 134, which is an electroplated layer, is formed directly on the nickel layer 133. The thickness of the copper layer 134 may approximately be 2 to 20 micrometers, and preferably 5 to 10 micrometers, for example. The plane shape of the copper layer 134 is substantially the same as the plane shape of the metal layer 131 and the copper layer 132. The copper layer 134 is formed to align with the metal layer 131 and the copper layer 132 in a plan view. In a plan view, the copper layer 134 has a smaller area than the nickel layer 133, so that an outer ring of the nickel layer 133 is exposed beyond the outer perimeter of the copper layer 134.

The nickel layer 135, which is an electroplated layer, is formed directly on the copper layer 134. The thickness of the nickel layer 135 may approximately be 2 to 20 micrometers, and preferably 5 to 10 micrometers, for example. The plane shape of the nickel layer 135 is substantially the same as the plane shape of the nickel layer 133. The nickel layer 135 is formed to align with the nickel layer 133 in a plan view. The plane shape of the nickel layer 135 may be substantially circular, for example. In this case, the diameter of the nickel layer 135 is approximately 1 to 20 micrometers larger than the diameter of the copper layer 134. In other words, an outer perimeter ring of the nickel layer 135 protrudes beyond the lateral surface of the copper layer 134. The amount of protrusion may be adjustable to be approximately 0.5 to 10 micrometers, and may preferably be about 2 to 5 micrometers. The amount of protrusion of an outer perimeter ring of the nickel layer 135 extending beyond the lateral surface of the copper layer 134 is greater than the thickness of the metal layer 131 (i.e., seed layer) situated directly beneath the copper layer 132.

The solder layer 136 is formed directly on the nickel layer 135. The shape of the solder layer 136 is a dome shape, for example. The dome shape refers to a shape whose surface is raised around the center, and gradually descends toward the perimeter edge. The thickness of the solder layer 136 (i.e., the maximum thickness around the center) may approximately be 10 micrometers, for example. The plane shape of the solder layer 136 is substantially the same as the plane shape of the nickel layer 135. The solder layer 136 is formed to align with the nickel layer 135 in a plan view. An alloy including Pb, an alloy of Sn and Cu, an alloy of Sn and Ag, or an alloy of Sn, Ag, and Cu may be used as a material to form the solder layer 136.

Method of Making Copper Pillar Bump of First Embodiment

In the following, a method of making the copper pillar bump of the first embodiment will be described. FIGS. 2A through 2C to FIGS. 4A and 4B are drawings illustrating an example of process steps of making the copper pillar bump according to the first embodiment.

Figure 2A:
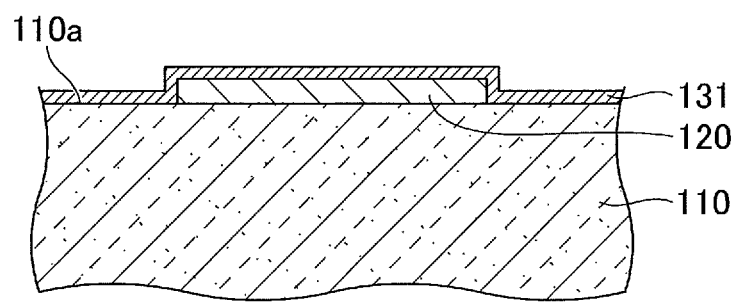
FIGS. 2A through 2C are drawings illustrating an example of process steps of making the copper pillar bump according to the first embodiment.

In the process step illustrated in FIG. 2A, a semiconductor substrate 110 having an electrode pad 120 formed on the circuit surface 110a is prepared. A metal layer 131 is then formed on the semiconductor substrate 110 and the electrode pad 120. The material and thickness of the metal layer 131 are the same as those previously described. The metal layer 131 may be formed by electroless plating or sputtering, for example.

Figure 2B:
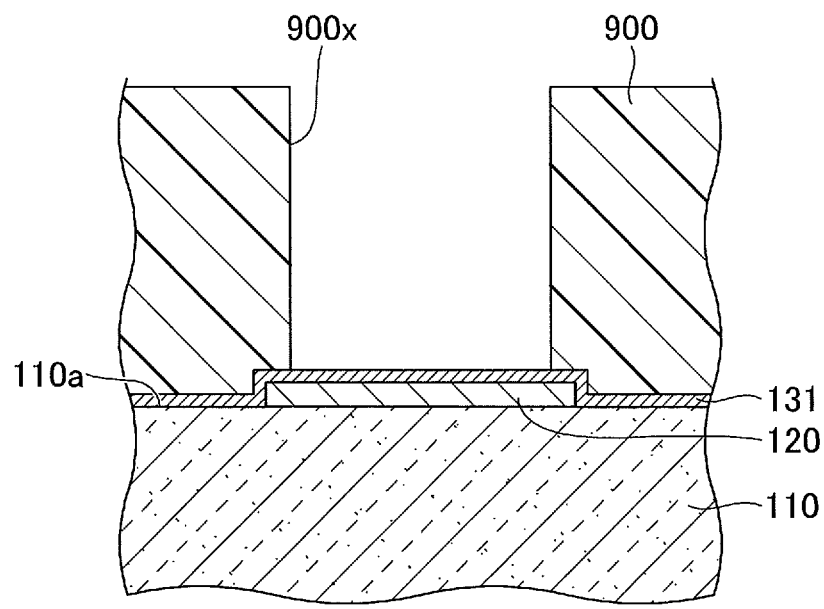

In the process step illustrated in FIG. 2B, a resist layer 900 is formed on the circuit surface 110a of the semiconductor substrate 110. Specifically, a dry-film resist made of photosensitive resin or the like may be laminated as the resist layer 900 on the circuit surface 110a of the semiconductor substrate 110, for example. The resist layer 900 made of dry-film resist or the like is then patterned through exposure and development, which forms an opening 900x selectively exposing the upper surface of the metal layer 131 at the place where the copper layer 132 is to be formed.

Figure 2C:
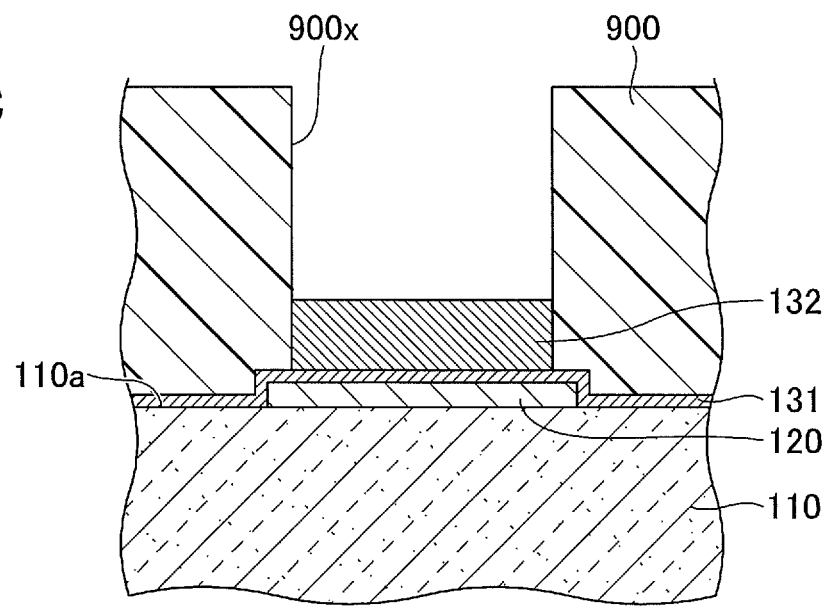

In the process step illustrated in FIG. 2C, electrolytic plating that utilizes the metal layer 131 as a seed layer (i.e., plating power feeding layer) forms a copper layer 132 on the upper surface portion of the metal layer 131 that is exposed in the opening 900x of the resist layer 900. The thickness of the copper layer 132 is the same as the one previously described.

Figure 3A:
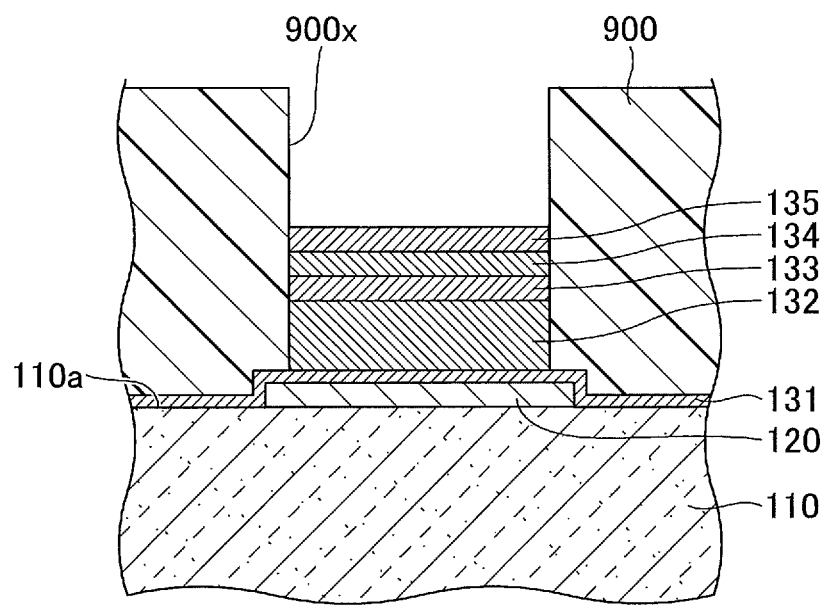
FIGS. 3A through 3C are drawings illustrating an example of process steps of making the interconnect substrate according to the first embodiment.

In the process step illustrated in FIG. 3A, electrolytic plating that utilizes the metal layer 131 as a seed layer (i.e., plating power feeding layer) forms a nickel layer 133, a copper layer 134, and a nickel layer 135 stacked in this order on the copper layer 132. The thicknesses of the nickel layer 133, the copper layer 134, and the nickel layer 135 are the same as those previously described.

Figure 3B:
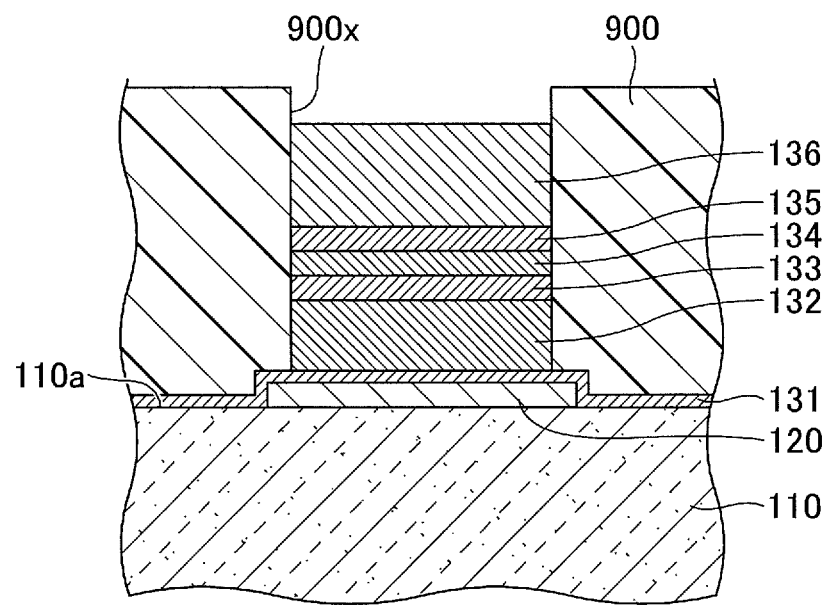

In the process step illustrated in FIG. 3B, electrolytic plating that utilizes the metal layer 131 as a seed layer (i.e., plating power feeding layer) forms a solder layer 136 on the nickel layer 135. The material and thickness of the solder layer 136 are the same as those previously described.

Figure 3C:
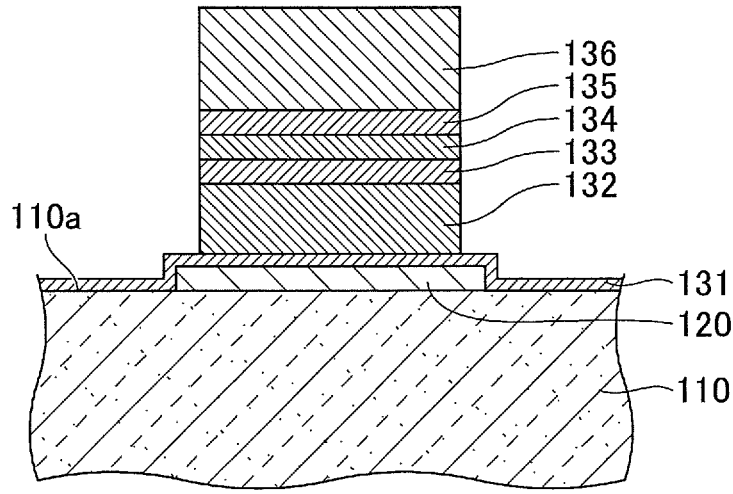

In the process step illustrated in FIG. 3C, the resist layer 900 illustrated in FIG. 3C is removed. The resist layer 900 may be removed by use of a stripping solution containing sodium hydroxide or the like, for example.

Figure 4A:
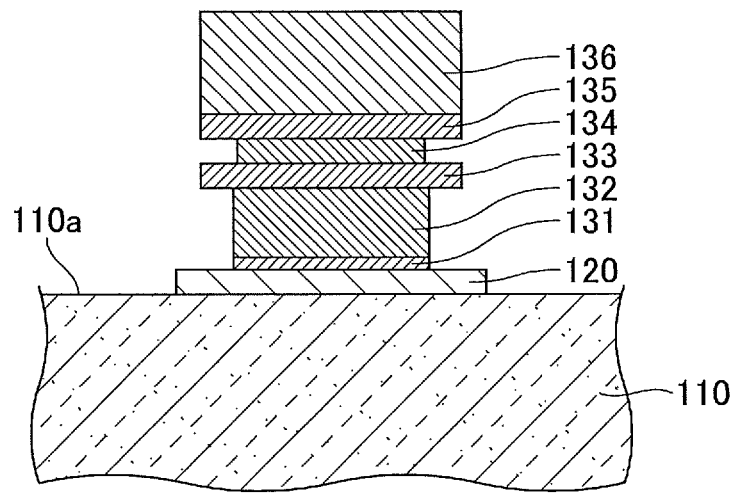
FIGS. 4A and 4B are drawings illustrating an example of process steps of making the interconnect substrate according to the first embodiment.

In the process step illustrated in FIG. 4A, an etching solution capable of etching copper is used to dissolve and remove the metal layer 131 that is not covered with the copper layer 132. Examples of such etching solution include a hydrogen peroxide/sulfuric solution, a sodium persulfate solution, a ammonium persulfate solution, nitric acid, and the like.

During this etching process, the nickel layers 133 and 135 are not dissolved by the etching solution capable of etching copper, so that a copper layer contained in the metal layer 131 (i.e., a laminated film including a titanium layer and a copper layer laminated thereon), the copper layer 132, and the copper layer 134 are selectively etched. As a result, the metal layer 131 that is not covered with the copper layer 132 is removed, and the outer perimeter portions of the copper layers 132 and 134 are etched.

The outer perimeter ring of the nickel layer 133 thus protrudes beyond the lateral surface of the copper layer 132, and the outer perimeter ring of the nickel layer 135 protrudes beyond the lateral surface of the copper layer 134. Controlling the etching time and the like enables the amount of protrusion of the nickel layers 133 and 135 to be greater than the thickness of the metal layer 131.

Subsequently, the titanium layer included in the metal layer 131 is removed by an etching solution that is capable of dissolving titanium without dissolving copper and nickel. As a result, any portion of the metal layer 131 that is not covered with the copper layer 132 is removed.

Figure 4B:
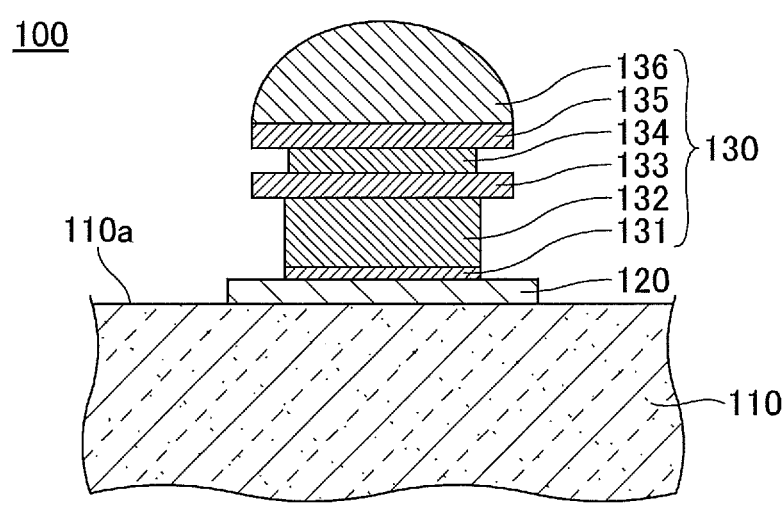

In the process step illustrated in FIG. 4B, a reflow process or the like is performed so that the solder layer 136 is melted and then hardened to turn into a dome shape. In this manner, the copper pillar bump 130 is formed on the electrode pad 120, so that the semiconductor chip 100 is completed in final form.

In the following, the advantages of the copper pillar bump 130 will be described by referring to a comparative example.

Figure 5A:
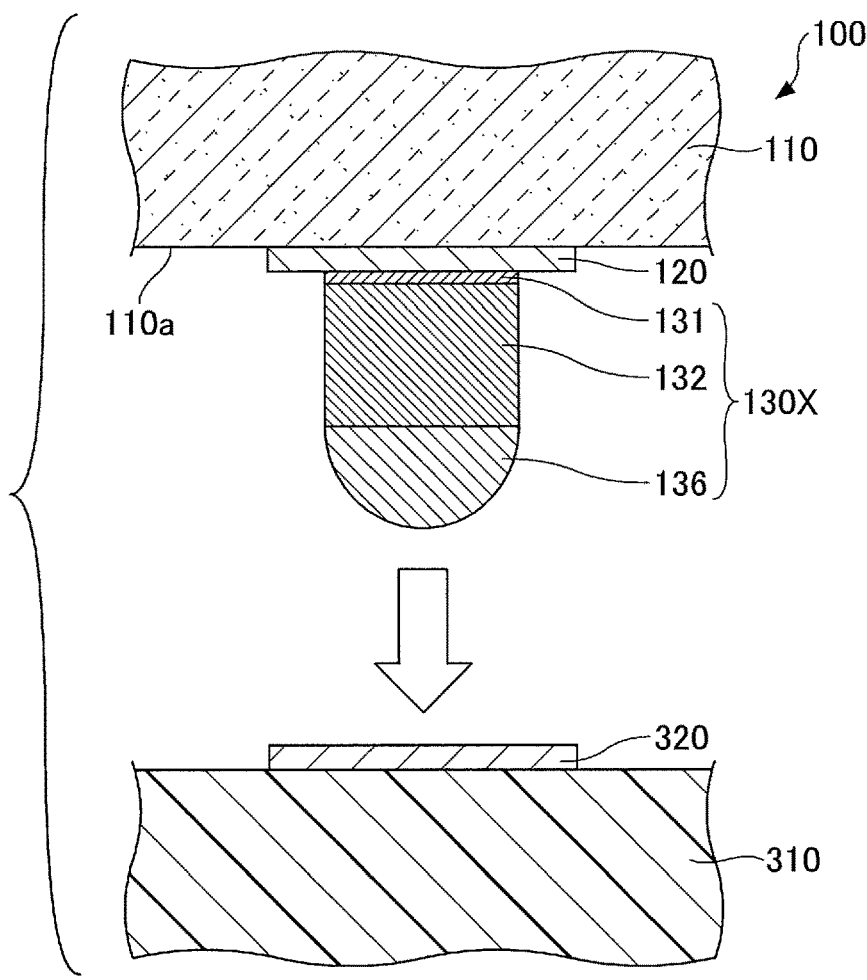
FIGS. 5A and 5B are schematic drawings illustrating how a semiconductor chip of a comparative example is connected to a pad on an interconnect substrate.
Figure 5B:
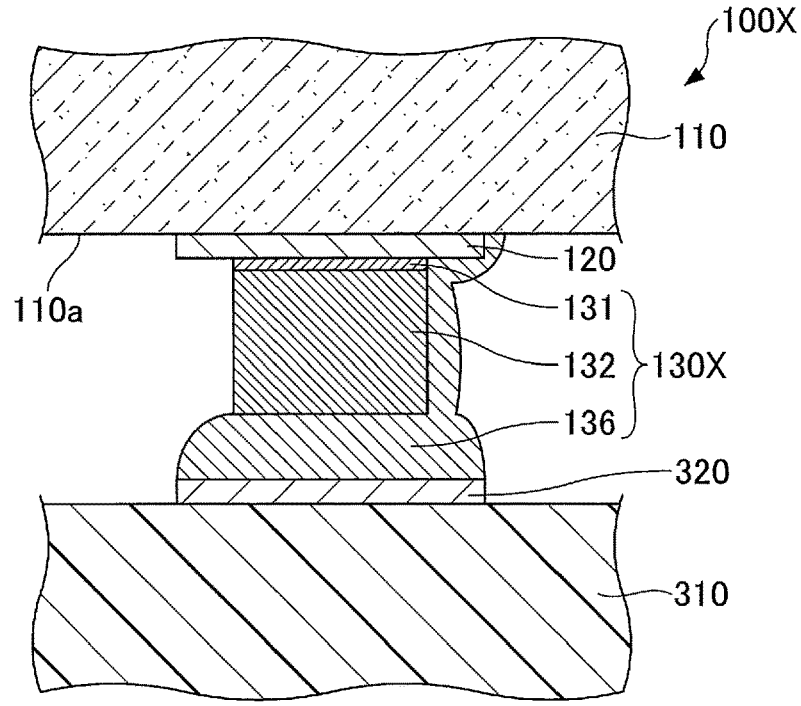

FIGS. 5A and 5B are schematic drawings illustrating how a semiconductor chip of a comparative example is connected to a pad on an interconnect substrate. In a semiconductor chip 100X illustrated in FIG. 5A, a copper pillar bump 130X is disposed on the electrode pad 120. The copper pillar bump 130X differs from the copper pillar bump 130 (see FIG. 1 and the like) in that the nickel layer 133, the copper layer 134, and the nickel layer 135 are not provided.

As illustrated in FIG. 5A, the semiconductor chip 100X is positioned such that the copper pillar bump 130X is disposed over a pad 320 of an interconnect substrate 310 to face the pad 320, followed by melting and then hardening the solder layer 136 of the copper pillar bump 130X. When a large amount of solder is used for the solder layer 136, for example, excessive solder creeps along the lateral surface of the copper pillar bump 130X as illustrated in FIG. 5B, which may result in the solder coming in contact with the circuit surface 11a of the semiconductor chip 100X. In such a case, solder coming in contact with the circuit surface 110a may cause trouble such as a short-circuit or the like However, a large amount of solder is indispensable in order to establish a highly reliable connection, so that reducing the amount of solder is not a viable option.

Figure 6A:
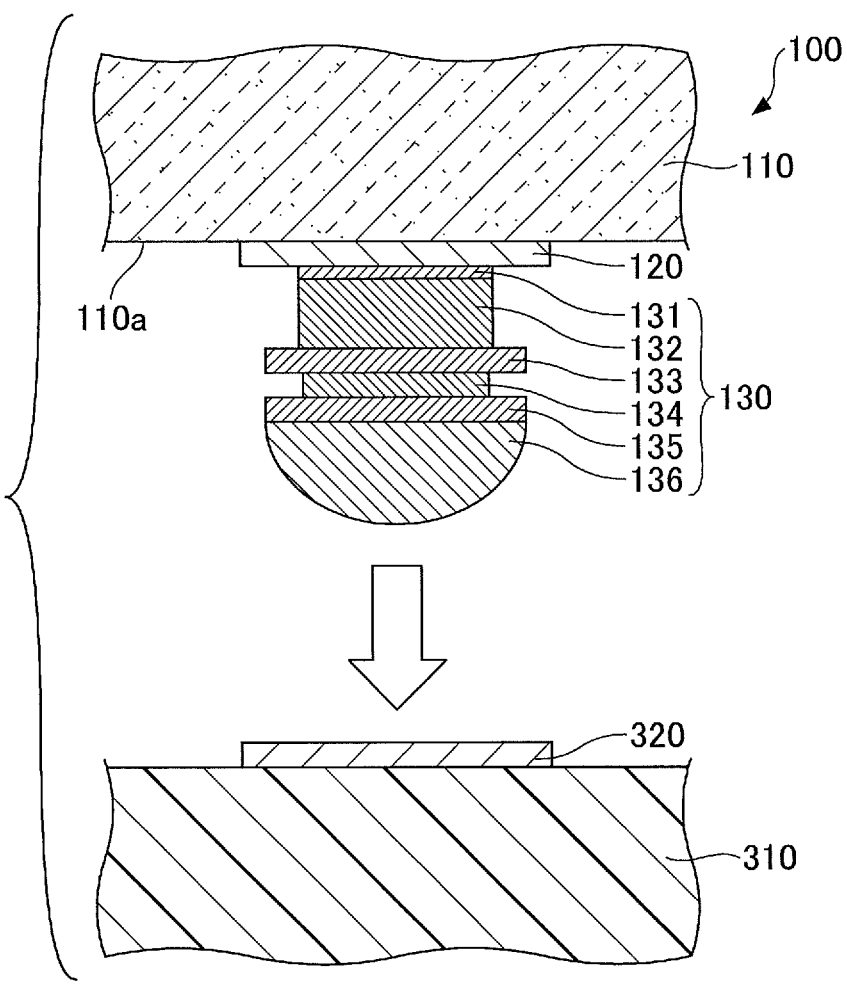
FIGS. 6A and 6B are schematic drawings illustrating how the semiconductor chip of the embodiment is connected to a pad on an interconnect substrate.
Figure 6B:
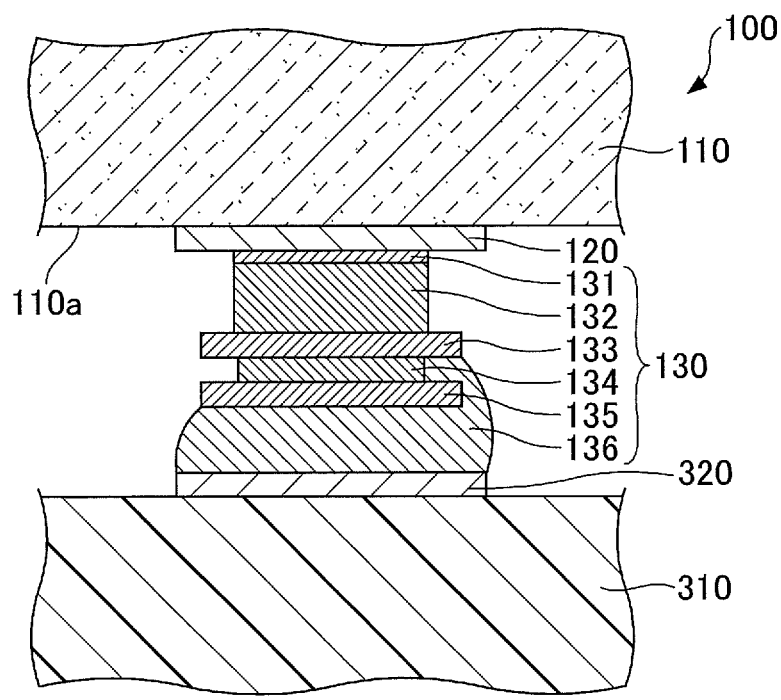

FIGS. 6A and 6B are schematic drawings illustrating how the semiconductor chip of the present embodiment is connected to a pad on an interconnect substrate. Unlike the semiconductor chip 100X, the semiconductor chip 100 has the copper pillar bump 130. Namely, the outer perimeter ring of the nickel layer 133 protrudes beyond the lateral surface of the copper layer 132, and the outer perimeter ring of the nickel layer 135 protrudes beyond the lateral surface of the copper layer 134.

With the above-noted arrangement, excessive solder does not creep along the lateral surface of the copper pillar bump 130 during the process of melting and then hardening the solder layer 136 after the semiconductor chip 100 is positioned such that the copper pillar bump 130 is disposed over the pad 320 of the interconnect substrate 310 to face the pad 320 as illustrated in FIG. 6A. Namely, even when a large amount of solder is used for the solder layer 136, the nickel layers 133 and 135 having a lower solder wettability than a copper layer reduces the likelihood of excessive solder creeping along the lateral surface of the copper pillar bump 130. In particular, the provision of protrusions of the nickel layers 133 and 135 increases a surface area of the portion on which solder creeps, and also increases the distance of the path extending to the semiconductor chip 100, which further reduces the likelihood of excessive solder creeping along the path. Even when excessive solder creeps along the lateral surface of the copper pillar bump 130, the excessive solder is blocked at the protrusion of the nickel layer 133 as illustrated in FIG. 6B, without reaching the circuit surface 110a of the semiconductor chip 100.

In the manner described above, the nickel layer 133 serves as a dam for the copper pillar bump 130, so that excessive solder is blocked at the protrusion of the nickel layer, without reaching the circuit surface 110a of the semiconductor chip 100. This arrangement reduces the risk that solder comes in contact with the circuit surface 110a of the semiconductor chip to cause trouble such as a short-circuit or the like.

One or more laminated films each having a copper layer and a nickel layer staked one on another is preferably formed between the nickel layer 133 and the copper layer 134. Such one or more laminated films are each configured such that an outer perimeter ring of the nickel layer protrudes beyond the lateral surface of the copper layer. This arrangement increases the number of nickel layers serving as a dam, so that excessive solder is blocked at the protrusion of each nickel layer, and is thus increasingly unlikely to reach the circuit surface 110a of the semiconductor chip 100.

The descriptions provided heretofore have been directed to an example in which a copper layer and a nickel layer are stacked one on another in the copper pillar bump 130. Alternatively, a metal layer other than a nickel layer may be used as long as the metal layer is made of a metal having a different etching rate than copper. As a metal having a different etching rate than copper, any one of chromium (Cr), titanium (Ti), tantalum (Ta), cobalt (Co), gold (Au), silver (Ag), platinum (Pt), and palladium (Pd) may be used in place of nickel. Among these, any one of Ni, Cr, Ti, Ta, and Co is preferably used. These materials have a lower solder wettability than a copper layer, thereby reducing the likelihood of excessive solder creeping along the lateral surface of the copper pillar bump 130.

First Variation of First Embodiment

A first variation of the first embodiment is directed to an example of a copper pillar bump having a different laminated layer structure than the first embodiment. In connection with the first variation of the first embodiment, a description of the same or similar constituent elements as those of the previously provided descriptions may be omitted as appropriate.

Figure 7:
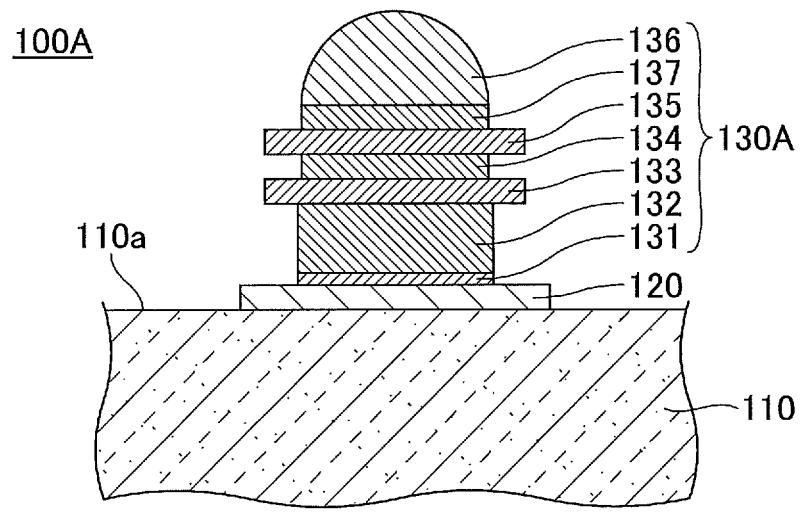
FIG. 7 is a partial cross-sectional view illustrating an example of a semiconductor chip having a copper pillar bump according to a first variation of the first embodiment.

FIG. 7 is a partial cross-sectional view illustrating an example of a semiconductor chip having a copper pillar bump according to a first variation of the first embodiment. In FIG. 7, a semiconductor chip 100A includes a semiconductor substrate 110, an electrode pad 120, and a copper pillar bump 130A. The copper pillar bump 130A differs from the copper pillar bump 130 (see FIG. 1 and the like) in that a copper layer 137 is additionally disposed between the nickel layer 135 and the solder layer 136. In other words, the copper pillar bump 130A has the copper layer 137 laminated directly on the nickel layer 135, and has the solder layer 136 laminated directly on the copper layer 137.

The copper layer 137, which is an electroplated layer, is formed directly on the nickel layer 135. The thickness of the copper layer 137 may approximately be 2 to 20 micrometers, and preferably 5 to 10 micrometers, for example. The plane shape of the copper layer 137 is substantially the same as the plane shape of the metal layer 131, the copper layer 132, and the copper layer 134. The copper layer 137 is formed to align with the metal layer 131, the copper layer 132, and the copper layer 134 in a plan view. In a plan view, the copper layer 137 has a smaller area than the nickel layer 135, so that an outer ring of the nickel layer 135 is exposed beyond the outer perimeter of the copper layer 137.

In this manner, the layer situated beneath the solder layer 136 may suitably be a copper layer. In this case also, the outer perimeter ring of the nickel layer 133 protrudes beyond the lateral surface of the copper layer 132, and the outer perimeter ring of the nickel layer 135 protrudes beyond the lateral surface of the copper layer 134, so that substantially the same advantages as in the first embodiment are achieved.

Second Variation of First Embodiment

The second variation of the first embodiment is directed to an example in which no solder layer is provided at the top. In connection with the second variation of the first embodiment, a description of the same or similar constituent elements as those of the previously provided descriptions may be omitted as appropriate.

Figure 8:
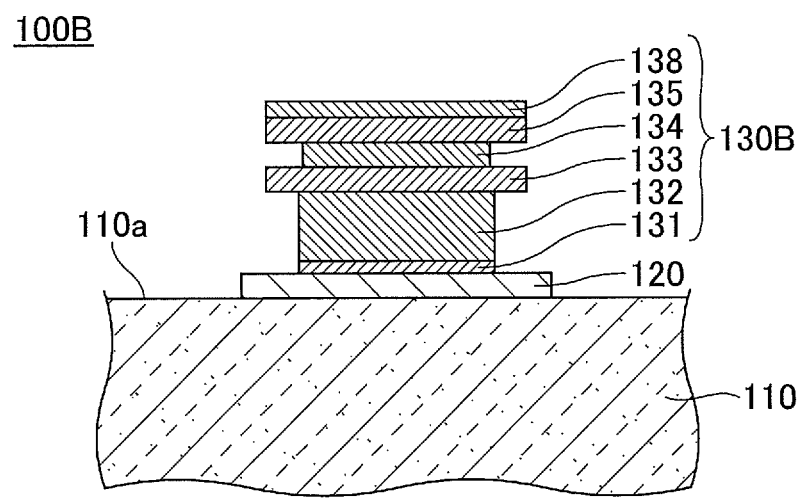
FIG. 8 is a partial cross-sectional view illustrating an example of a semiconductor chip having a copper pillar bump according to a second variation of the first embodiment.

FIG. 8 is a partial cross-sectional view illustrating an example of a semiconductor chip having a copper pillar bump according to a second variation of the first embodiment. In FIG. 8, a semiconductor chip 100B includes a semiconductor substrate 110, an electrode pad 120, and a copper pillar bump 130B. The copper pillar bump 130B differs from the copper pillar bump 130 (see FIG. 1 and the like) in that a metal layer 138 is formed directly on the nickel layer 135 as the topmost layer, in place of the solder layer.

The metal layer 138 is provided to improve the reliability of connection with solder, and is made of a material having higher solder wettability than the nickel layer 135. Examples of the metal layer 138 include an Au film, a Pd/Au film (which is a metal layer having a Pd layer and an Au layer laminated in this order), and the like. The metal layer 138 may be formed by electrolytic plating, or may be formed by electroless plating.

As described above, the copper pillar bump 130B may not have a solder layer. In such a case, solder may be disposed in advance on a pad of the interconnect substrate, for example. Alternatively, solder may be deposited on the metal layer 138 of the copper pillar bump 130B and/or on a pad of the interconnect substrate when connecting the copper pillar bump 130B to the pad of the interconnect substrate.

Second Embodiment

The second embodiment is directed to an example of a semiconductor apparatus in which an interconnect substrate and a semiconductor chip are electrically connected to each other via copper pillar bumps. In connection with the second embodiment, a description of the same or similar constituent elements as those of the previously provided descriptions may be omitted as appropriate.

Figure 9:
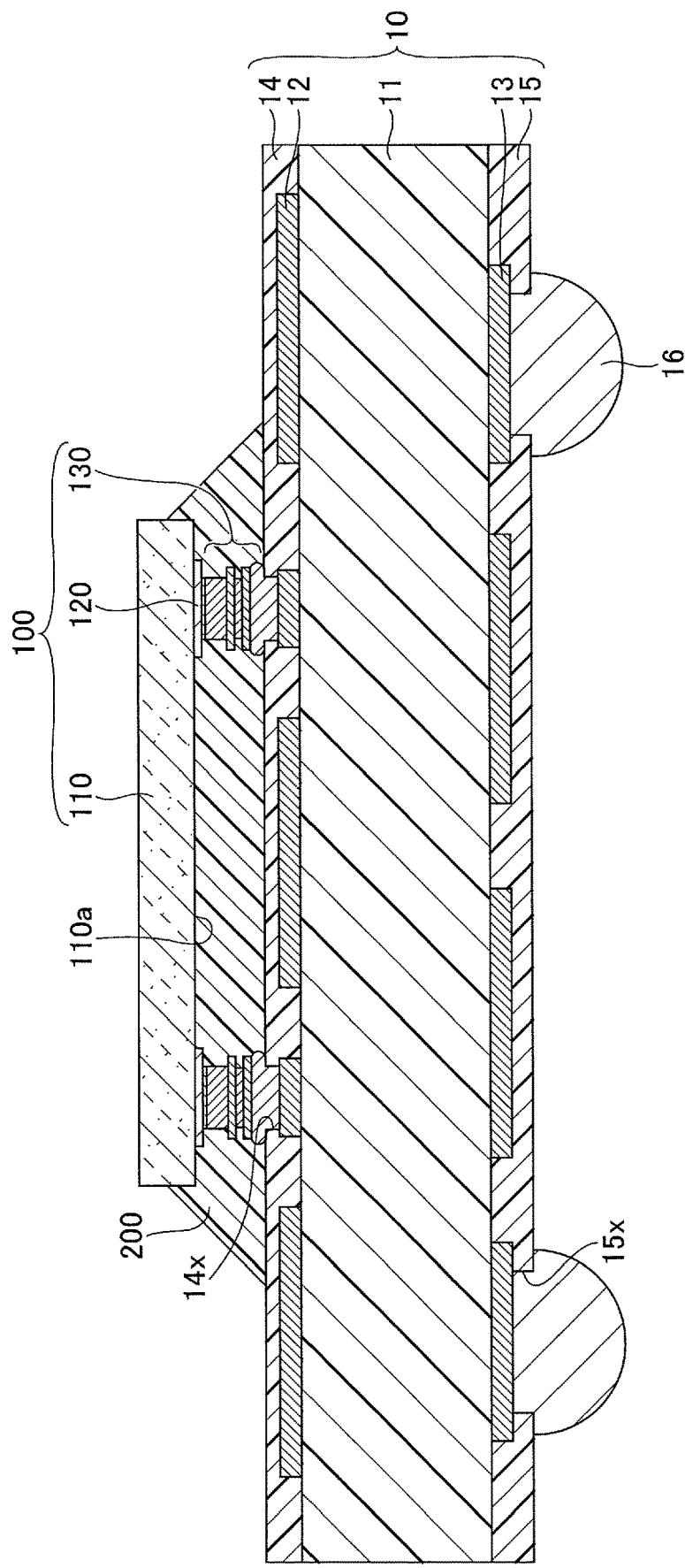
FIG. 9 is a cross-sectional view illustrating an example of a semiconductor apparatus according to a second embodiment.

FIG. 9 is a cross-sectional view illustrating an example of a semiconductor apparatus according to the second embodiment. In FIG. 9, a semiconductor apparatus 1 includes a interconnect substrate 10, a semiconductor chip 100, and an underfill resin 200. The interconnect substrate 10 includes an insulating layer 11 made of an insulating resin or the like, interconnect layers 12 and 13 made of copper or the like, solder resist layers 14 and 15 made of an insulating resin or the like, and solder bumps 16.

In the interconnect substrate 10, the interconnect layer 12 is formed on the first surface of the insulating layer 11, and the interconnect layer 13 is formed on the second surface. Further, the solder resist layer 14 covering the interconnect layer 12 is formed on the first surface of the insulating layer 11, with openings 14x of the solder resist layer 14 exposing portions of the interconnect layer 12. Moreover, the solder resist layer 15 covering the interconnect layer 13 is formed on the second surface of the insulating layer 11, with openings 15x of the solder resist layer 15 exposing portions of the interconnect layer 13. The portions of the interconnect layer 13 exposed through the openings 15x have solder bumps 16 formed thereon.

It may be noted that in FIG. 9, the insulating layer 11 is illustrated as a single insulating layer, but the insulating layer 11 may be implemented as a multilayer interconnect substrate. A multilayer interconnect substrate may include insulating layers and interconnect layers alternating with each other in a laminated structure, with some interconnect layers being electrically connected to each other through via interconnects extending through an insulating layer, for example. The multilayer interconnect substrate may have a core substrate, or may be a coreless substrate. The core substrate may include a reinforcement material such as glass epoxy.

The semiconductor chip 100 is flip-chip mounted on the interconnect substrate 10, with the circuit surface 110a facing the solder resist layer 14 (i.e., in a face-down position). Specifically, the electrode pads 120 of the semiconductor chip 100 are electrically coupled via the copper pillar bumps 130 to the interconnect layer 12 exposed in the openings 14x of the solder resist layer 14. More specifically, the solder layers 136 of the copper pillar bumps 130 are melted and then hardened, thereby being connected to the interconnect layer 12 exposed in the openings 14x of the solder resist layer 14.

The underfill resin 200 fills the gap between the circuit surface 110a of the semiconductor chip 100 and the upper surface of the solder resist layer 14 of the interconnect substrate 10. The underfill resin 200 may cover the entirety or part of the lateral faces of the semiconductor chip 100. The underfill resin 200 does not cover the back face of the semiconductor chip 100. A mold resin may be additionally provided on the interconnect substrate 10 to cover the semiconductor chip 100 and the underfill resin 200.

As was described above, the electrode pads 120 of the semiconductor chip 100 are electrically coupled via the copper pillar bumps 130 to the interconnect layer 12 exposed in the openings 14x of the solder resist layer 14. As was previously described, the copper pillar bumps 130 are such that the outer perimeter ring of the nickel layer 133 protrudes beyond the lateral surface of the copper layer 132, and the outer perimeter ring of the nickel layer 135 protrudes beyond the lateral surface of the copper layer 134. When the solder layer 136 of each copper pillar bump 130 is melted in order to connect the electrode pad 120 to the interconnect layer 12, excessive solder is blocked at the protrusion of the nickel layer 133, without reaching the circuit surface 110a of the semiconductor chip 100. This arrangement reduces the risk that solder comes in contact with the circuit surface 110a of the semiconductor chip to cause trouble such as a short-circuit or the like.

In order to dispose the underfill resin 200, a resin is poured into the gap between the circuit surface 110a of the semiconductor chip 100 and the upper surface of the solder resist layer 14 of the interconnect substrate 10 after the electrode pads 120 are connected to the interconnect layer 12. In the case in which the underfill resin 200 contains a filler, the contained filler is preferably has an average particle diameter smaller than the gap between the protrusion of the nickel layer 133 and the protrusion of the nickel layer 135 (i.e., the thickness of the copper layer 134).

This arrangement prevents the filler from being stuck between the protrusion of the nickel layer 133 and the protrusion of the nickel layer 135. Further, the underfill resin 200 containing the filler can cover the entirety of the copper pillar bump 130, let alone the gap between the protrusion of the nickel layer 133 and the protrusion of the nickel layer 135, thereby serving to disperse stress.

The method of supplying the underfill resin 200 is not limited to the example noted above. For example, an underfill resin film may be disposed on the interconnect substrate 10 in advance, and the copper pillar bumps 130 of the semiconductor chip 100 may be connected to the interconnect substrate 10 by penetrating through the underfill resin.

It may be noted that in the case of using the method of pouring a resin into the gap between the circuit surface 110a of the semiconductor chip 100 and the upper surface of the solder resist layer 14 of the interconnect substrate 10, the copper pillar bumps 130 are surrounded by air when connecting the electrode pads 120 to the interconnect layer 12. Because of this, solder creeps up along the lateral surface of the copper pillar bump 130 more easily in the case of using the method of pouring resin into the gap than in the case of using the method of utilizing an underfill resin film. The advantage of providing the protrusion of a nickel layer (i.e., the creepage prevention effect) is thus more prominent in such a case.

The structure of the semiconductor apparatus 1 described above is only an example, and the semiconductor chip 100 having the copper pillar bumps 130 may be mountable on interconnect substrates having various structures. Further, the semiconductor chip 100 having the copper pillar bumps 130 may be embedded in the interconnect substrate. Moreover, the copper pillar bump 130A or 130B may be used in place of the copper pillar bump 130.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A copper pillar bump for an electrode pad of a semiconductor chip, comprising:
   a first copper layer;
   a first metal layer formed directly on the first copper layer;
   a second copper layer formed directly on the first metal layer; and
   a second metal layer formed directly on the second copper layer,
   wherein the first metal layer and the second metal layer consist of a same material, the material including a metal having a different etching rate than copper,
   wherein an outer perimeter ring of the first metal layer protrudes beyond a lateral surface of the first copper layer, and
   wherein an outer perimeter ring of the second metal layer protrudes beyond a lateral surface of the second copper layer.

2. The copper pillar bump as claimed in claim 1, further comprising
   a seed layer formed directly beneath the first copper layer,
   wherein an amount of protrusion of the outer perimeter ring of the first metal layer extending beyond the lateral surface of the first copper layer and an amount of protrusion of the outer perimeter ring of the second metal layer extending beyond the lateral surface of the second copper layer are greater than a thickness of the seed layer.

3. The copper pillar bump as claimed in claim 1, wherein a material of the first metal layer and the second metal layer is any one of Ni, Cr, Ti, Ta, Co, Au, Ag, Pt, and Pd.

4. The copper pillar bump as claimed in claim 3, wherein a material of the first metal layer and the second metal layer is any one of Ni, Cr, Ti, Ta, and Co.

5. The copper pillar bump as claimed in claim 1, further comprising one or more laminated films each having both a third copper layer and, laminated thereon, a third metal layer made of a metal having a different etching rate than copper, the one or more laminated films being formed between the first metal layer and the second copper layer,
   wherein an outer perimeter ring of the third metal layer protrudes beyond a lateral surface of the third copper layer.

6. The copper pillar bump as claimed in claim 1, further comprising a solder layer formed directly on the second metal layer.

7. The copper pillar bump as claimed in claim 1, further comprising a metal layer formed directly on the second metal layer and made of a material having a greater solder wettability than the second metal layer.

8. The copper pillar bump as claimed in claim 1, further comprising a copper layer and a solder layer sequentially formed directly on the second metal layer.

9. A semiconductor chip comprising:
an electrode pad; and
the copper pillar bump of claim 1 formed on the electrode pad.

10. A semiconductor apparatus, comprising:
an interconnect substrate; and
the semiconductor chip of claim 9,
wherein the interconnect substrate and the semiconductor chip are electrically connected to each other via the copper pillar bump.

11. The copper pillar bump as claimed in claim 1, further comprising a seed layer formed directly beneath the first copper layer, wherein the seed layer has a thickness of 0.01 to 0.3 micrometers, and
wherein an amount of protrusion of the outer perimeter ring of the first metal layer extending beyond the lateral surface of the first copper layer and an amount of protrusion of the outer perimeter ring of the second metal layer extending beyond the lateral surface of the second copper layer are 2 to 5 micrometers.

\* \* \* \* \*